United States Patent [19]

Van Ommen

[11] Patent Number: 4,653,176
[45] Date of Patent: Mar. 31, 1987

[54] METHOD OF SIMULTANEOUSLY MANUFACTURING SEMICONDUCTOR REGIONS HAVING DIFFERENT DOPINGS

[75] Inventor: Alfred H. Van Ommen, Eindhoven, Netherlands

[73] Assignee: U.S. Philips Corporation, New York, N.Y.

[21] Appl. No.: 709,465

[22] Filed: Mar. 7, 1985

[30] Foreign Application Priority Data

Mar. 13, 1984 [NL] Netherlands .......................... 8400789

[51] Int. Cl.⁴ .................... H01L 21/38; H01L 21/425
[52] U.S. Cl. .................................... 29/578; 29/576 B; 148/1.5; 148/187; 148/DIG. 136; 148/DIG. 77; 148/DIG. 83
[58] Field of Search ............... 29/578, 576 B; 148/1.5, 148/DIG. 136, DIG. 77, DIG. 83, 187

[56] References Cited

U.S. PATENT DOCUMENTS 3,432,792  3/1969  Hatcher, Jr. ............. 148/DIG. 136
3,570,114  3/1971  Bean et al. ................ 148/DIG. 136
3,739,237  6/1973  Shannan ............................ 29/576 B
3,921,283  11/1975  Shappir .................................. 29/578
4,329,186  5/1982  Kotecha et al. ................... 29/576 B

OTHER PUBLICATIONS

*Ion Implantation*, Dearnaley et al., North-Holland Pub. Comp. Amsterdam, 1973.

Primary Examiner—George T. Ozaki
Attorney, Agent, or Firm—Paul R. Miller

[57] ABSTRACT

A method of simultaneously manufacturing semiconductor regions having different doping concentrations, for example, for obtaining semiconductor resistors having differences values. Due to difference in the rate of oxidation, oxide edges of different widths can be formed by oxidation of n-type silicon regions thus obtained. According to the invention, ion implantation or deposition takes place through doping windows for each of which the ratio between the window surface area and the surface area to be doped is different. Subsequently, homogeneous doping concentrations are obtained by diffusion.

15 Claims, 9 Drawing Figures

METHOD OF SIMULTANEOUSLY MANUFACTURING SEMICONDUCTOR REGIONS HAVING DIFFERENT DOPINGS

The invention relates to a method of manufacturing layer-shaped structures on a carrier body, in which at least two semiconductor regions are formed on the carrier body, which regions are provided with different dopings using a doping mask.

The invention further relates to a device manufactured by the use of the method.

A method of the kind described is known, for example, from U.S. Pat. No. 3,921,283. This patent discloses how the gate electrodes of complementary MOS transistors consisting of polycrystalline silicon are provided with different dopings by ion implantation through a mask.

The manufacture of structures with details of very small dimensions is of importance in various fields of technology. This especially applies to the field of microelectronics and more particularly the field of integrated circuits, wherein the complexity increases and the dimensions of the structural details correspondingly decrease with advancing technology. Thus, when thin-film resistors having widely different values must be used in an integrated circuit in order to avoid the use of extreme dimensions, it may be of importance to utilize for this purpose narrow silicon strips of approximately comparable dimensions, but of different doping.

However, the manufacture of structures with small details may be of importace also outside the field of semiconductor technology. An example in this connection is the manufacture of optical diffraction gratings.

The present invention provides the possibility of manufacturing simultaneously during the same doping process semiconductor regions having different dopings. Moreover, according to the invention, these semiconductor regions can serve as a starting point for obtaining very small structural details of or in other materials.

The invention is based on recognition of the fact that this can be achieved by an efficacious choice of the dimensions of the doping mask.

The invention is further based on recognition of the fact that the influence of the doping concentration on the rate of oxidation can be suitably utilized.

According to the invention, a method as described in the opening paragraph is characterized in that windows are provided in the doping mask above the semiconductor regions, the ratio between the surface area of a window and that of the underlying semiconductor region to be doped being different for at least two semiconductor regions, in that during the same doping step the dopant is introduced into the windows and in that in order to provide each semiconductor region with a substantially homogeneous doping concentration, a thermal diffusion is then carried out in which the dopant substantially does not penetrate into the carrier body.

Since the overall dose of the doping atoms introduced into each semiconductor region is determined by the ratio between the surface area of the part of the semiconductor region to be doped lying within the doping window and the overall surface area of this region, the doping can be provided simultaneously in one doping step, after which by thermal diffusion the doping is redistributed uniformly over the relevant semiconductor regions. In this manner, for example, a number of resistors having widely different resistance values, but having substantially the same dimensions, can be formed in an integrated circuit in one single doping and heating step. The resistors may consist, for example, of thin strips of poly-crystalline silicon lying on an oxide layer.

The doping can be effected by a deposition at elevated temperature in a window provided in a mask of, for example, silicon oxide, as is usual in normal diffusion processes. This method can be used when high doping concentrations are required. However, preferably the doping is carried out by ion implantation because a better reproducibility can then be obtained. Furthermore, low doping concentrations can then be realized in a much more controllable manner, while moreover a photolacquer mask is sufficient.

Preferably, the semiconductor regions are provided on dielectric material because the diffusion of the dopant is mostly negligible therein. Furthermore, during the diffusion the semiconductor regions are preferably covered at least on the upper side with a protective layer in order to avoid evaporation of the dopant.

The semiconductor regions advantageously consist of polycrystalline or amorphous silicon. The rate of diffusion therein is high so that neither long diffusion times nor very high temperatures are required.

The homogeneously doped semiconductor regions obtained by means of the method described can be used according to a very important preferred embodiment to realize oxide details having submicron dimensions and having different widths. For this purpose, according to this preferred embodiment, the semiconductor regions consist of silicon, while a donor element, for example, arsenic or phosphorus, is used as a dopant. After the thermal diffusion for redistribution of the dopant, the differently doped silicon regions obtained are thermally oxidized. The thickest oxide layer is then formed on the regions having the highest doping. The upper side of the silicon regions is preferably coated with an anti-oxidation layer so that only the exposed edges are oxidized. After the oxidation, if desired, the non-oxidized parts of the silicon regions may be selectively removed, for example, by etching, so that only the oxide structures are left. These structures may be used, for example, in diffraction gratings or other fine structures or as auxiliary means in further processes, as will be explained below.

A doping window may consist of a single slot-shaped opening in the longitudinal direction of the underlying semiconductor region. However, the window may alternatively comprise a number of mutually separated openings, of which the relative distance must then be at most equal to approximately twice the diffusion length of the dopant in a lateral direction. The term diffusion length as used herein is to be understood to mean the distance from the window over which the doping concentration decreases to a value equal to $1/e$ times the maximum value. The relative distance of the aforementioned openings must in fact be so small that by diffusion in the lateral direction a redistribution of the dopant can be obtained, which results in a substantially homogeneous doping concentration, and therefore this distance will generally not exceed approximately 10 to 12 $\mu$m.

The invention will now be described more fully with reference to a few preferred embodiments and the drawing, in which.

The Figures are schematic and not drawn to scale. This holds true especially for the dimensions in the direction of thickness. Corresponding parts are generally designated to the Figures by the same reference numerals.

Figure 1:
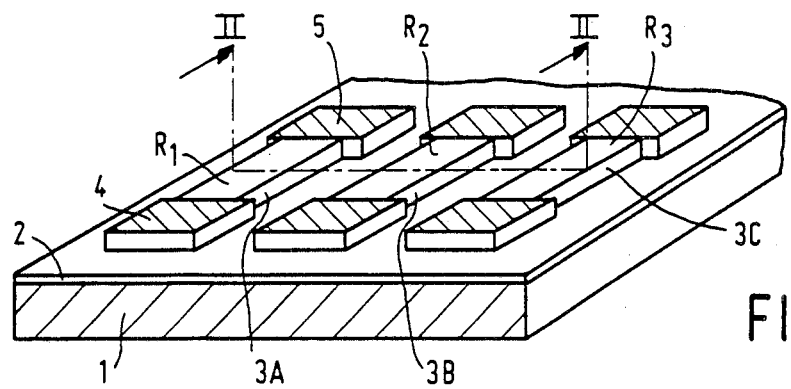
FIG. 1 is a perspective view of three semiconductor resistors manufactured by use of a method according to the invention.

FIG. 1 shows in perspective view a part of a device manufactured by using the method according to the invention. The Figure shows a carrier body consisting of a substrate 1 of silicon on which an electrically insulating layer 2 of silicon oxide is disposed, which in this example has a thickness of 0.5 $\mu$m. On the layer 2 are disposed three semiconductor resistors $R_1$, $R_2$ and $R_3$ each consisting of a strip-shaped layer (3A, 3B, 3C) of polycrystalline or amorphous silicon having at the ends widened parts 4 and 5, which are metallized (cross-hatched areas) and serve for providing electrical connection conductors. In the silicon wafer 1 circuit elements of an integrated circuit may be present, such as transistors and diodes (not shown here), which are connected through openings in the layer 2 directly or via conductor tracks to the resistors $R_1$, $R_2$ and $R_3$. The silicon strips 3A, 3B and 3C, which constitute the resistors $R_1$, $R_2$ and $R_3$, have different doping concentrations. As a result, though the dimensions of length, width and thickness of the resistors are substantially equal, they have different values.

Figure 2:
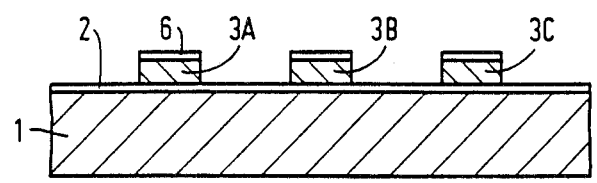
FIGS. 2 and 3 show a sectional view taken along the plane II—II in FIG. 1 successive stages of the method.

According to the invention, the resistors are manufactured in the following manner. On the oxide layer 2 is deposited a 0.5 $\mu$m thick layer 3 of polycrystalline silicon by thermal decomposition of a gaseous silicon compound, for example, silane ($SiH_4$). As the case may be after a very light oxidation, a thin layer 6 of silicon nitride or silicon oxynitride is formed on the layer 3. The thickness of the layer 6 is about 20 nm. The layer 6 may also consist of another insulating material, for example, silicon oxide. Subsequently, by using conventional photolithographic etching methods, the layers 3 and 6 are shaped into the form of the resistors (see FIG. 1), FIG. 2 showing a diagrammatic sectional view taken on the plane II—II.

Figure 3:
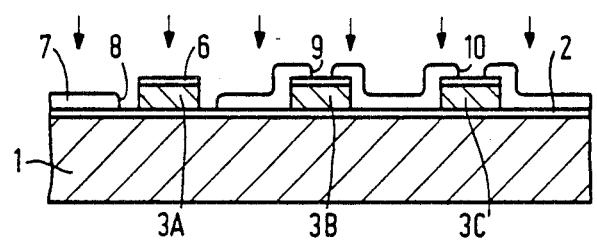
Figure 4:
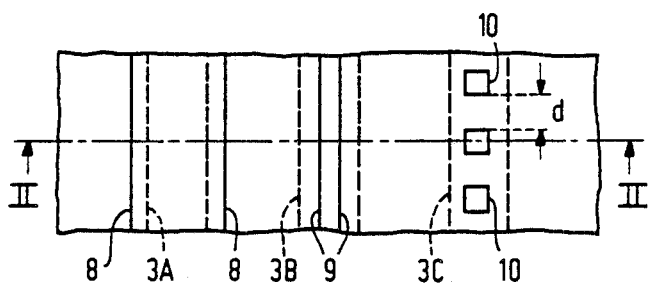
FIG. 4 shows a partial plan view at the stage of FIG. 3.

A doping mask, in this case an implantation mask, is now applied to the whole. For this purpose (see FIG. 3), a 5 $\mu$m thick photolacquer layer 7 is applied, in which implantation windows 8, 9 and 10 are formed above the semiconductor regions 3A, 3B and 3C by exposure and development. The resistors $R_1$, $R_2$ and $R_3$ each have (between the contact surfaces 4 and 5) a length of 50 $\mu$m and a width of 10 $\mu$m. The window 8 has a width of 14 $\mu$m and the window 9 has a width of 1 $\mu$m; both windows extend in the form of a slot in the longitudinal direction of the strips 3A, B and C, as can be seen in the plan view of FIG. 4. The boundaries of the strips 3A, B and C are indicated in this Figure by broken lines and those of the windows 8, 9 and 10 by full lines. The window 10 comprises a number of square openings of $1 \times 1$ $\mu$m with a relative distance d of about 4 $\mu$m.

In the direction of the arrows (see FIG. 3), phosphorus ions are now implanted at a dose (in the silicon) of $2.5 \times 10^{15}$ ions/cm$^2$ and an energy of 200 keV. The ions are stopped by the photolacquer layer 7, but not by the nitride layer 6. Implantation through an insulating layer has the advantage that the semiconductor surface is then damaged to a lesser extent.

Subsequently, the implantation mask is removed and the whole is heated at 1100° C. for 90 minutes in an atmosphere of nitrogen. As a result, such a diffusion of the phosphorus atoms takes place that a homogeneous doping concentration is obtained in each of the three silicon regions 3A, B and C. During this thermal diffusion, the layer 6 acts as a protective layer to counteract evaporation of the phosphorus.

For the resistor $R_1$, of which the whole surface area of $5 \cdot 10^{-6}$ cm$^2$ is implanted, this results in a homogeneous doping $N = 5.10^{19}$ atoms/cm$^3$. For polycrystalline silicon, this approximately corresponds to a resistivity of $10^{-2}$ $\Omega$.cm so that $R_1 = 1$ k$\Omega$.

For $R_2$ the ratio of the surface area of the implantation window to that of the whole resistor is 1:10 so that after diffusion $N = 5 \cdot 10^{18}$ atoms/cm$^3$, which corresponds to a resistivity of $10^{-1}$ $\Omega$.cm, from which it follows that $R_2 = 10$ k$\Omega$.

For $R_3$ the ratio (with ten windows of $1 \times 1$ $\mu$m) is 1:50 so that after $N = 10^{18}$ atoms/cm$^3$. This corresponds for polycrystalline silicon to a resistivity of about 1 $\Omega$.cm so that $R_3 = 100$ k$\Omega$.

Consequently, with one implantation three resistors of substantially the same dimensions are obtained, whose resistance values differ from each other by a factor 50.

In the following example, semiconductor regions having different doping concentrations manufactured in accordance with the invention are used for forming structures with oxide details of considerably smaller dimensions than those of the doping windows used. For this purpose, the known difference in rate of oxidation between n-type silicon regions having different doping concentrations is utilized. See, for example, the article of Sunami in Journal of the Electro-chemical Society, June 1978, pp. 892-897.

On a substrate 1, for example, of aluminum oxide, is deposited a 100 nm thick layer 3 of polycrystalline silicon, on which, like in the preceding example, a layer 6 of silicon nitride or silicon oxynitride is formed.

Figure 5:
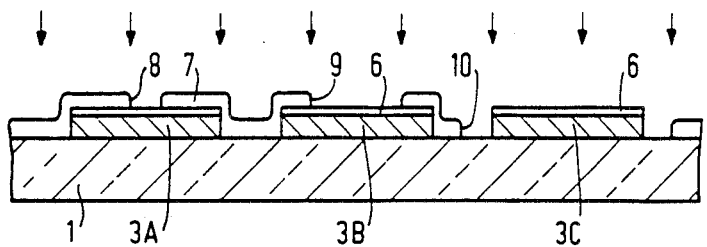
FIGS. 5 to 7 show a sectional view of the successive stages of another embodiment of a method according to the invention, and FIGS. 8 and 9 respectively show a plan view and a sectional view of a stage of a further embodiment of a method according to the invention.
Figure 6:
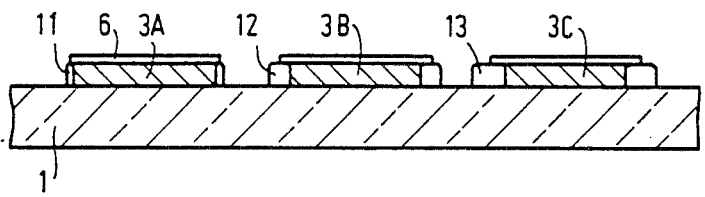

By the use of known photolithographic etching techniques, the layers 3 and 6 are now arranged in a pattern which is shown diagrammatically in cross section in FIG. 5. The edges of this pattern determine the areas at which the ultimate oxide pattern will be formed.

Like in the preceding example, a doping mask in the form of a photolacquer mask 7 is now formed with windows 8, 9 and 10 which extend continuously throughout the length of the regions 3A, 3B and 3C. The regions 3A, 3B and 3C extend in this example at right angles to the plane of the drawing and have the form of strips having a width of 10 $\mu$m. However, they may also have different widths provided that their width is so small that within a reasonable time a homogeneous doping concentration can be obtained by thermal diffusion.

By ion implantation (through the layer 6), phosphorus is implanted in the direction of the arrows (see FIG. 5), after which the photolacquer layer 7 is removed and a homogeneous doping is produced in each of the regions 3A, 3B and 3C by diffusion in nitrogen for about one hour at 1100° C. The layer 6 again serves as a protective layer during this diffusion. Instead of the silicon nitride-containing layer 6, a layer of a different material may also be used. In this example it is preferred that the silicon nitride-containing layer 6, which acts at the same time as an anti-oxidation layer, is maintained.

Figure 7:
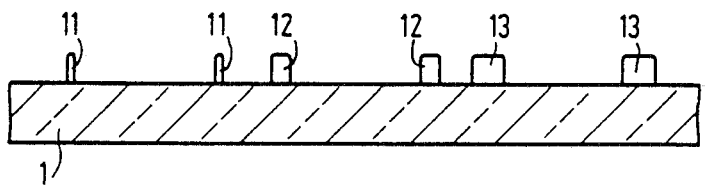

By oxidation at, for example, 750° C. in wet oxygen for 60 minutes, the edges of the regions 3A, B and C are now oxidized. Oxide edges 11, 12 and 13 of different thicknesses are then formed due to the difference in the dopings of the regions 3A, 3B and 3C. By selective etching, the layer 6 and the remaining silicon regions 3A, B and C are then removed. Thus, the oxide structures 11, 12 and 13 remain (see FIG. 7), which may be used for different purposes.

The following table indicates the width of the various oxide edges, which can be obtained by one implantation and one oxidation step, with different doping windows. The starting material comprises 10 μm wide silicon strips having a thickness of 100 nm, an implantation dose of $10^{16}$ phosphorus ions (in the silicon) per cm² and an implantation energy of 200 keV, the oxidation being carried out at 750° C. in wet oxygen for 60 minutes. For comparison, the oxide edge for undoped polycrystalline silicon is also stated.

| Width A of implantation window | Width B of oxide edge | Ratio $\frac{A}{B}$ |
| --- | --- | --- |
| (closed: undoped) | 18 nm | — |
| 2 μm | 57 nm | 35 |
| 4 μm | 100 nm | 40 |
| 6 μm | 146 nm | 41 |
| 8 μm | 192 nm | 42 |
| 10 μm | 237 nm | 42 |

It appears from the last column that the oxide structures obtained are about 40 times smaller than the implantation windows defined by means of the usual photolithography and that for windows wider than 2 μm this is substantially independent of the window width. The method described above may be used for various purposes. Especially, it may be of importance for determining small distance, for example, for forming grooves or slots of different widths in a semiconductor layer, in which event the distance and the groove width, respectively, is determined by the width of the oxide edges. Such a method, also designated as "PABLO" (Precision Alignment by Local Oxidation), is described in the published British Patent Application No. 2111304 of the Applicant. However, the method may also be used outside the semiconductor field, for example, for manufacturing optical diffraction gratings having a variable grating constant and/or -width and for manufacturing other fine structures with structural details having considerably smaller dimensions than those which can be obtained directly by photolithographic methods.

The invention is not limited to the embodiments described herein. For example, instead of ion implantation, also a deposition at elevated temperature may be used, as is usual in conventional diffusion methods. However, a heat-resistant layer, of, for example, silicon oxide or silicon nitride, must then be used as the mask, while this heat-resistant mask itself must again be shaped into the required form by means of a photolacquer mask and an etching step. Furthermore, semiconductor materials other than silicon, and dopants (donors or acceptors) other than those mentioned herein may be used.

Figure 8:
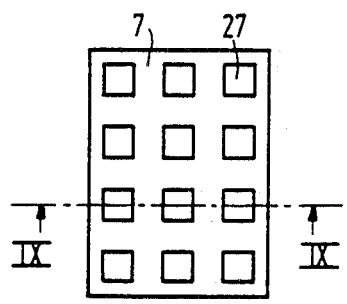
Figure 9:
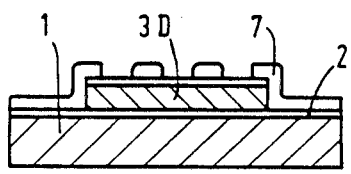

Instead of polycrystalline or amorphous material, the semiconductor regions may comprise monocrystalline material. As for the doping windows, it should be noted that they may comprise a number of openings mutually separated not only in one direction (as in FIG. 4 over region 3C), but also in several directions. See, for example, FIGS. 8 and 9, which show a plan view and a sectional view, respectively, of a semiconductor region 3D with a photolacquer mask 7 comprising a two-dimensional matrix of openings 27. It will be appreciated that also in this case in any direction the maximum distance between the openings 27 must not exceed about twice the diffusion length of the dopant in order to obtain a substantially homogeneous doping concentration of the semiconductor region 3D. Thus, more variations are possible; in FIG. 4, for example, the slot-shaped window 9 may comprise a number of mutually separated parallel slots.

What is claimed is:

1. A method of manufacturing layer-shaped structures on a carrier body, comprising the steps of providing first and second semiconductor regions formed on the carrier body, which regions are provided with different doping concentrations using a doping mask, providing first and second windows respectively in the doping mask above the first and second semiconductor regions, the ratio between the surface area of the first window and that of the first semiconductor region being different than the ratio between the surface area of the second window and that of the second semiconductor region, introducing agent during a single doping step into the first and second windows, providing the first and second semiconductor regions with substantially homogenous first and second doping concentrations respectively by which a thermal diffusion is carried out, wherein the dopant substantially does not penetrate into the carrier body.

2. A method as claimed in claim 1, characterized in that the carrier body comprises a layer of dielectric material, the first and second semiconductor regions being formed on the dielectric material.

3. A method as claimed in claim 1, characterized in that the first and second semiconductor regions consist of polycrystalline or amorphous silicon.

4. A method as claimed in claim 1, characterized in that during the thermal diffusion the first and second semiconductor regions are covered at least on an upper side thereof with a protective layer in order to prevent evaporation of the dopant.

5. A method as claimed in claim 4, characterized in that the protective layer comprises silicon oxide or silicon nitride.

6. A method as claimed in either claim 1 or 4, characterized in that the first and second semiconductor regions are formed as strips on the carrier body and have different resistance values, the resistance value of each semiconductor region depending on the respective doping concentration.

7. A method as claimed in claim 6, characterized in that the resistance strips formed have substantially the same dimensions.

8. A method as claimed in claim 1, in which the first and second semiconductor regions consist of silicon and a donor element is used as the dopant, characterized in that after the thermal diffusion the first and second semiconductor regions are thermally oxidized, the thicker oxide layer being formed on the semiconductor region having the higher doping concentration.

9. A method as claimed in claim 8, characterized in that during the oxidation the first and second semiconductor regions are covered on an upper side thereof with an antioxidation layer so that only exposed edges of the semiconductor regions are oxidized.

10. A method as claimed in claim 9, characterized in that after the oxidation remaining non-oxidized parts of the semiconductor regions are selectively removed by etching.

11. A method as claimed in claim 1, characterized in that the first window comprises a plurality of openings arranged in a row, each of the openings being separated from the next opening in the row by a distance which is equal to no more than about twice the diffusion length of the dopant in a lateral direction.

12. A method as claimed in claim 1, characterized in that the first and second doping concentrations are provided by ion implantation in the first and second windows of the doping mask.

13. A method as claimed in claim 12, characterized in that an implantation mask of photolacquer is used as a doping mask.

14. A method as claimed in either claim 12 or 13, characterized in that the first and second semiconductor regions are covered with an electrically insulating layer, on which the doping mask is provided.

15. A method of manufacturing layer-shaped structures on a carrier body, comprising the steps of providing first and second semiconductor regions having substantially equal thicknesses formed on the carrier body, which regions are provided with different doping concentrations using a doping mask, providing first and second windows respectively in the doping mask above the first and second semiconductor regions, the ratio between the surface area of the first window and that of the first semiconductor region being different than the ratio between the surface area of the second window and that of the second semiconductor region, introducing dopant during a single doping step into the first and second windows, providing the first and second semiconductor regions with substantially homogenous first and second doping concentrations respectively by which a thermal diffusion is carried out, wherein the dopant substantially does not penetrate into the carrier body.

* * * * *